US 9,224,449 B2

(12) United States Patent
Dally

(10) Patent No.: US 9,224,449 B2
(45) Date of Patent: Dec. 29, 2015

(54) VARIABLE DYNAMIC MEMORY REFRESH

(71) Applicant: NVIDIA Corporation, Santa Clara, CA (US)

(72) Inventor: William J. Dally, Los Altos Hills, CA (US)

(73) Assignee: NVIDIA Corporation, Santa Clara, CA (US)

(*) Notice: Subject to any disclaimer, the term of this patent is extended or adjusted under 35 U.S.C. 154(b) by 106 days.

(21) Appl. No.: 13/794,563

(22) Filed: Mar. 11, 2013

(65) Prior Publication Data

US 2014/0254298 A1 Sep. 11, 2014

(51) Int. Cl.
G11C 11/406 (2006.01)
G11C 29/02 (2006.01)
G11C 29/50 (2006.01)

(52) U.S. Cl.
CPC ........ *G11C 11/406* (2013.01); *G11C 11/40622* (2013.01); *G11C 11/40626* (2013.01); *G11C 29/023* (2013.01); *G11C 29/028* (2013.01); *G11C 29/50016* (2013.01)

(58) Field of Classification Search
CPC .................................................. G11C 11/406
USPC ....................................................... 365/222
See application file for complete search history.

(56) References Cited

U.S. PATENT DOCUMENTS

| 5,278,796 | A | 1/1994 | Tillinghast et al. |
| 6,438,057 | B1 | 8/2002 | Ruckerbauer |
| 6,483,764 | B2 | 11/2002 | Hsu et al. |
| 6,781,908 | B1 | 8/2004 | Pelley et al. |
| 7,035,157 | B2 | 4/2006 | Chang |
| 7,177,218 | B2 | 2/2007 | Choi et al. |
| 7,751,241 | B2 * | 7/2010 | Wang et al. ............. 365/185.03 |
| 8,705,302 | B2 * | 4/2014 | Kang et al. .................... 365/203 |
| 2005/0099868 | A1 * | 5/2005 | Oh ................................ 365/222 |
| 2010/0110748 | A1 * | 5/2010 | Best ................................ 365/51 |
| 2010/0165689 | A1 * | 7/2010 | Rotbard et al. ................. 365/45 |
| 2011/0289349 | A1 | 11/2011 | Loeser et al. |
| 2012/0083612 | A1 * | 4/2012 | Dang et al. .................... 549/533 |
| 2012/0287692 | A1 * | 11/2012 | Rotbard et al. ................. 365/45 |
| 2012/0294100 | A1 * | 11/2012 | Ling et al. ...................... 365/200 |
| 2014/0063997 | A1 * | 3/2014 | Franceschini et al. ........ 365/201 |

FOREIGN PATENT DOCUMENTS

DE 10042383 A1 3/2002

OTHER PUBLICATIONS

Hamamoto, T. et al., "On the Retention Time Distribution of Dynamic Random Access Memory (DRAM)," IEEE Transactions on Electron Devices, Jun. 1998, vol. 45, No. 6, pp. 1300-1309.
Kagenishi, Y. et al., "Low Power Self Refresh Mode DRAM With Temperature Detecting Circuit," 1993, pp. 43-44.
Exam Report from German Patent Application No. 10 2013 114 365.2, dated Oct. 13, 2015.

* cited by examiner

*Primary Examiner* — Huan Hoang
*Assistant Examiner* — Minh Dinh
(74) *Attorney, Agent, or Firm* — Zilka-Kotab, PC

(57) ABSTRACT

A system and method are provided for refreshing a dynamic memory. A first region of a memory is refreshed at a first refresh rate and a second region of the memory is refreshed at a second refresh rate that is different than the first refresh rate. A memory controller is configured to refresh the first region of a memory at the first refresh rate and refresh the second region of the memory at the second refresh rate.

23 Claims, 8 Drawing Sheets

VARIABLE DYNAMIC MEMORY REFRESH

FIELD OF THE INVENTION

The present invention relates to dynamic memory, and more specifically to refreshing dynamic memory.

BACKGROUND

Conventional dynamic memory devices such as dynamic random access memory (DRAM) require that all rows be refreshed once each refresh interval (typically 64 ms) to preserve the data that is stored in the RAM. If the data is not refreshed, then over time, the charge that encodes the data in the memory cells leaks away. In fact, most DRAM rows can go many seconds between refresh operations at the high temperature limit and can retain data even longer at typical temperatures. Typically, the short refresh interval results from a few 'leaky' memory cells. Only the 'leaky' memory cells actually need the fast refresh rate. Unnecessarily refreshing all rows at the rate required by the 'leaky' memory cells wastes considerable power when the DRAM is not otherwise being used (i.e., in a standby mode). Wasting power is particularly objectionable in mobile applications that store power in batteries.

Thus, there is a need for reducing refresh rates and/or other issues associated with the prior art.

SUMMARY

A system and method are provided for refreshing a dynamic memory. A first region of a memory is refreshed at a first refresh rate and a second region of the memory is refreshed at a second refresh rate that is different than the first refresh rate. A memory controller is configured to refresh the first region of a memory at the first refresh rate and refresh the second region of the memory at the second refresh rate.

DETAILED DESCRIPTION

Contemporary DRAMs require that all rows be refreshed once each refresh interval (typically 64 ms). In fact, most DRAM pages can go many seconds between refresh operations at the high temperature limit and can hold their data even longer at typical temperatures. The short refresh interval is driven by a few 'leaky' memory locations. Only these locations need the very fast refresh rate. Unnecessarily refreshing all DRAM pages at the rate required by the worst page wastes considerable power when the DRAM is not otherwise being used (i.e., in a standby mode). This waste is particularly objectionable in mobile applications.

Rather than relying only on the refresh rate specified by the DRAM supplier, the different regions of the DRAM may be characterized during operation and the characterization information may be used to refresh different region at different refresh rates to reduce standby power.

Figure 1:
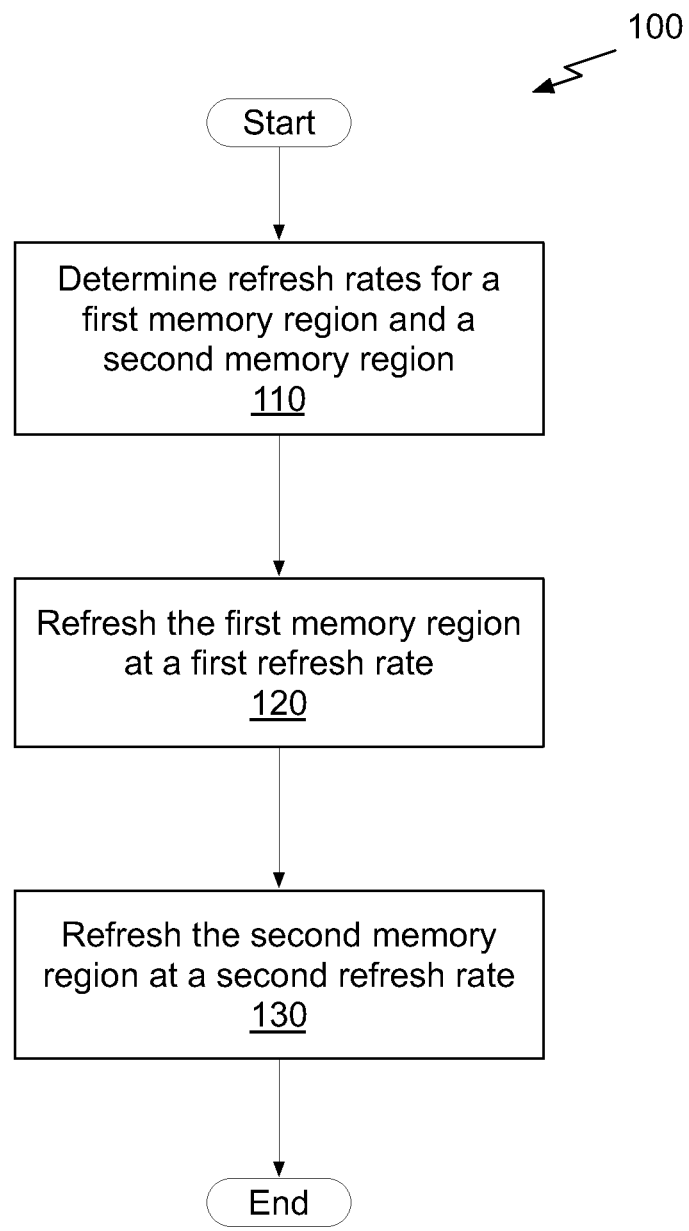
FIG. 1 illustrates a flowchart of a method for refreshing regions of a DRAM at different rates, in accordance with one embodiment.

FIG. 1 illustrates a flowchart 100 of a method for refreshing regions of a DRAM at different rates, in accordance with one embodiment. At step 110, refresh rates are determined for a first memory region and a second memory region. In one embodiment, each region corresponds to one or more rows of a DRAM device or one or more pages of a DRAM device. The refresh rates may be determined by characterizing the different rows or pages of a DRAM device. At step 120, the first memory region is refreshed at a first refresh rate. At step 130, the second memory region is refreshed at a second refresh rate that is different than the first refresh rate. In one embodiment, only one of the first or the second refresh rate is the refresh rate specified for the DRAM device by the DRAM device supplier or manufacturer. In another embodiment, neither the first nor the second refresh rate is the refresh rate specified for the DRAM device.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

In one embodiment, for each external DRAM device that is coupled to a computing device, a set of refresh registers in a memory controller may store a range of page addresses (bank and row) defining a region of memory and characterization information. The characterization information includes the refresh interval for the region of memory, where the refresh interval is the reciprocal of the refresh rate or rate at which the region should be refreshed. A memory refresh unit traverses each region, performing row activate and precharge operations to refresh each row or page in the region according to the refresh rate that is specific to the region. To determine which regions need to be refreshed at a given rate, the memory controller includes a temporary storage resource that is configured to store a copy of the data that is stored the region while characteristics of the DRAM are measured for the region.

Figure 2A:
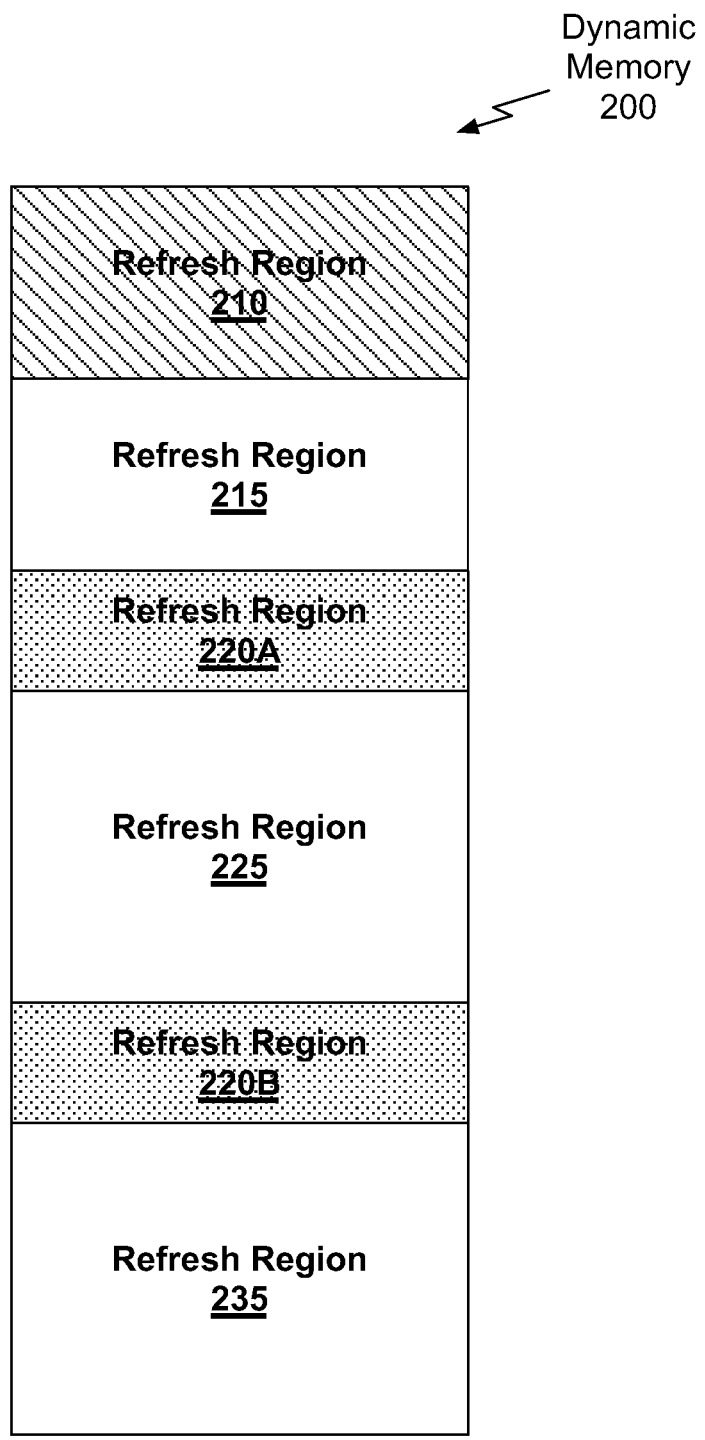
FIG. 2A illustrates different refresh rates for different regions of a dynamic memory, in accordance with one embodiment.

FIG. 2A illustrates different refresh rates for different regions of a dynamic memory 200, in accordance with one embodiment. Each pattern represents a different refresh rate and each region includes at least one row of memory. Rows within the refresh region 210 should be refreshed at a first refresh rate. Rows within the refresh regions 215, 225, and 235 may not have been characterized yet, and are therefore refreshed at the rate specified by the DRAM supplier. The rows within the refresh regions 220A and 220B should be refreshed at a second refresh rate.

A number of different techniques may be used to identify a region of memory that can be refreshed at a rate other than that specified by the DRAM supplier. One approach is to specify each refresh region using a single address (bank and/or row). The single address is represented by storing two bits that encode 0, 1, or X (don't care) for each bit of the single address in a refresh register. For example, if bank=0X01 and row=–0000.0100.0X11, the region contains rows 0x043 and 0x047 of banks 1 and 5. As shown in FIG. 2A, by the refresh regions 220A and 220B, each refresh region may be noncontiguous in physical memory. In other words, a particular refresh region may include a first portion of physical memory and a second portion of physical memory that is not contiguous with the first portion of physical memory. An alternative approach is to store a start address (bank and row) and an end address (bank and row) to specify each refresh region. For example, if start is bank=0011 row=0x045 and end address is bank=0100 row=0x32, all memory pages from bank 3 row 0x045 to bank 4 row 0x032 are included in the refresh region.

In one embodiment, a refresh register may store a priority sub-region. Adding a priority sub-region is a small refresh region that is carved out of a larger refresh region. For example, a large refresh region may be defined with priority=1 bank=01XX row=0000.0100.XXXX and refresh interval=4 sec. A small refresh region within the large refresh region may be defined by a second refresh register with priority=2 bank=0100 row=0000.0100.0111 refresh interval=1 sec. The refresh registers together specify that rows 0x040 through 0x04F in banks 4-7 are refreshed every 4 sec except for row 0x47 of bank 4 which is refreshed every 1 sec. When an address is included within multiple refresh regions, the highest priority refresh register that matches the address is selected. It should be noted that, while various optional features are set forth herein in connection with defining refresh regions of a memory, such features are for illustrative purposes only and should not be construed as limiting in any manner.

Figure 2B:
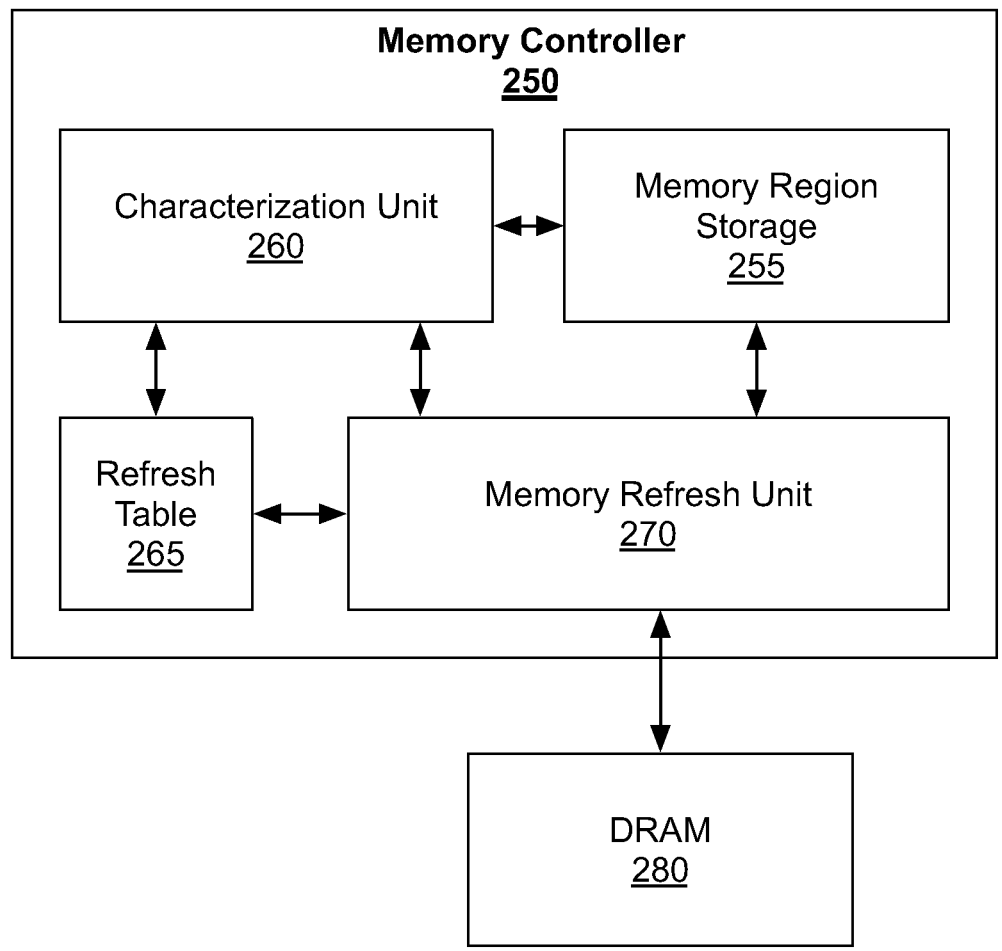
FIG. 2B illustrates a memory controller, in accordance with one embodiment.

FIG. 2B illustrates a memory controller 250, in accordance with one embodiment. The memory controller 250 includes a characterization unit 260, a refresh table 265, a memory region storage 255, and a memory refresh unit 270. The memory controller 250 also includes other components (not shown) to read data from the DRAM 280 and write data to the DRAM 280. The refresh table 265 includes a set of one or more refresh registers for each external DRAM device that is coupled to the memory controller 250. In addition to encoding a refresh region (a set of pages), a refresh register also encodes a refresh interval, a timer, and a next address field. As previously described a refresh register may also encode a priority and corresponding refresh sub-region along with a refresh interval, timer, and next address for the sub-region. In one embodiment, the refresh table 265 is implemented as a content-addressable-memory (CAM). In one embodiment, the refresh table 265 is a non-volatile memory so that the characterization data stored in the refresh registers does not have to be regenerated each time a system including the memory controller 250 is powered on.

The timer and next address fields are used by the memory refresh unit 270. The memory refresh unit 270 simultaneously traverses each refresh region (and refresh sub-region) and performs row activate and precharge operations on the set of addresses (i.e., row or page) corresponding to the next address when the timer corresponding to the refresh region (or refresh sub-region) has expired. The memory refresh unit 270 checks the timers each timestep, resetting expired timers and updating the next address for a refresh region (or refresh sub-region) when a refresh is performed. The timers for each refresh region (and refresh sub-region) are updated (i.e., decremented) each timestep.

To determine the refresh rate at which a region within the DRAM 280 should be refreshed, the memory controller 250 includes a memory region storage 255 that is configured to store a copy of the data that is stored the region in the memory region storage 255 while the characterization unit 260 measures the data retention characteristics of the region.

To determine the refresh interval for each memory region, the characterization unit 260 temporarily copies the data stored in the memory region into the memory region storage 255. The characterization unit 260 then measures the data retention characteristics of the memory region by writing patterns of data (e.g., alternating 1s and 0s 1010 . . . 10) to the memory region in the DRAM 280 via the memory refresh unit 270, waiting for a retention time period before reading the memory region from the DRAM 280 via the memory refresh unit 270, and checking if the data was retained by comparing the data read from the DRAM 280 with the patterns that were written to the memory region.

An example characterization test to measure data retention characteristics of a memory region is to repeat the writing, waiting, and reading of the memory region using a vector of exponentially increasing retention time periods. In one embodiment, the characterization unit 260 starts the retention time period at 64 ms, then the characterization unit 260 adjusts the retention time period to 128 msec, 0.25 sec, 0.5 sec, then 1 sec, and so on. For each retention time period, the characterization unit 260 repeats the writing and reading for several different patterns of data. When the characterization unit 260 detects an error (i.e., the pattern that was written does not match the pattern that is read) the characterization unit 260 adjusts the retention time period for the memory region. In one embodiment, the characterization unit 260 adjusts the refresh interval at least two steps back along the vector of retention time periods and, if the stepped back retention time period has not been tested, the writing and reading of patterns is repeated. For example, if the error occurred for the retention time period of 4 sec, the stepped back retention time period is 1 sec. If the stepped back retention time period does not produce an error, the stepped back retention time period may be stored in the refresh table 265 as the refresh interval for the memory region.

Refresh intervals may be sensitive to temperature and/or voltage levels. The memory refresh unit 270 may be configured to adjust the refresh intervals to increase refresh intervals (i.e., decrease refresh rates) when the DRAM 280 is operating at cooler temperatures rather than using the refresh interval stored in the refresh table 265. Similarly, the memory refresh unit 270 may be configured to adjust the refresh intervals to reduce refresh intervals (i.e., increase refresh rates) when the DRAM 280 is operating at lower voltages rather than using the refresh interval stored in the refresh table 265.

If temperature measurements are available, the characterization unit 260 can use the temperature measurements to adjust the refresh interval values stored in the refresh table 265 for the memory region to correspond to a reference temperature. For example, if the characterization is performed at a junction temperature of 60 degrees C. and a reference junction temperature is 40 degrees C., the refresh interval that is stored in the refresh table 265 for the memory region is increased by a factor of 4 (assuming that the refresh interval doubles for every –10 degree difference in junction temperature relative to the reference junction temperature) to correspond to the reference junction temperature. The characterization unit 260 may also be configured to adjust the refresh interval values stored in the refresh table 265 for the memory regions according to the measured voltage level and a reference voltage level.

The memory refresh unit 270 may be configured to adjust the refresh interval values according to temperature measurements when refreshing a memory region. For example, if the current junction temperature is measured as 60 degrees C. and the reference junction temperature is 40 degrees C., the refresh interval that is read from the refresh table 265 for the memory region can be reduced by a factor of 4 (assuming that the refresh interval can be halved for every +10 degree difference in junction temperature relative to the reference junction temperature) to control the rate at which the memory refresh unit 270 refreshes the memory region. The memory refresh unit 270 may also be configured to adjust the refresh interval values read from the refresh table 265 for the memory regions according to the measured voltage level and a reference voltage level.

It should be noted that, while various optional features are set forth herein in connection with characterizing regions of a memory and storing the characterization information, such features are for illustrative purposes only and should not be construed as limiting in any manner.

For some DRAMs 280 most memory regions will have a very long refresh interval (e.g., tens of seconds)—and only a tiny fraction of the memory in the DRAM 280, often only a single page or row, will have the worst-case refresh interval (e.g., 64 ms). For DRAMs 280 having a fraction of the memory that is particularly leaky (i.e., having high refresh rates or short refresh intervals), it may be practical to store the fraction of the memory having the worst-case refresh interval in the memory region storage 255. Effectively, all accesses to the one or more regions of memory are mapped to the memory region storage 255 so that the corresponding one or more regions of memory in the DRAM 280 are unused and do not need to be refreshed. In one embodiment, a portion of the memory region storage 255 may remain available for use by the characterization unit 260.

Conventionally, DRAM suppliers configure DRAM devices to replace rows having defective storage cells and rows having extremely short refresh intervals with spare rows within the DRAM device. However, replacement of a row within the DRAM device is done only to replace rows that are out of specification (i.e., have a refresh interval less than 64 ms). In contrast, the memory controller 250 may be configured to store the data for rows that are within the specification in the memory region storage 255 for the purpose of reducing overall standby power consumption.

Figure 3:
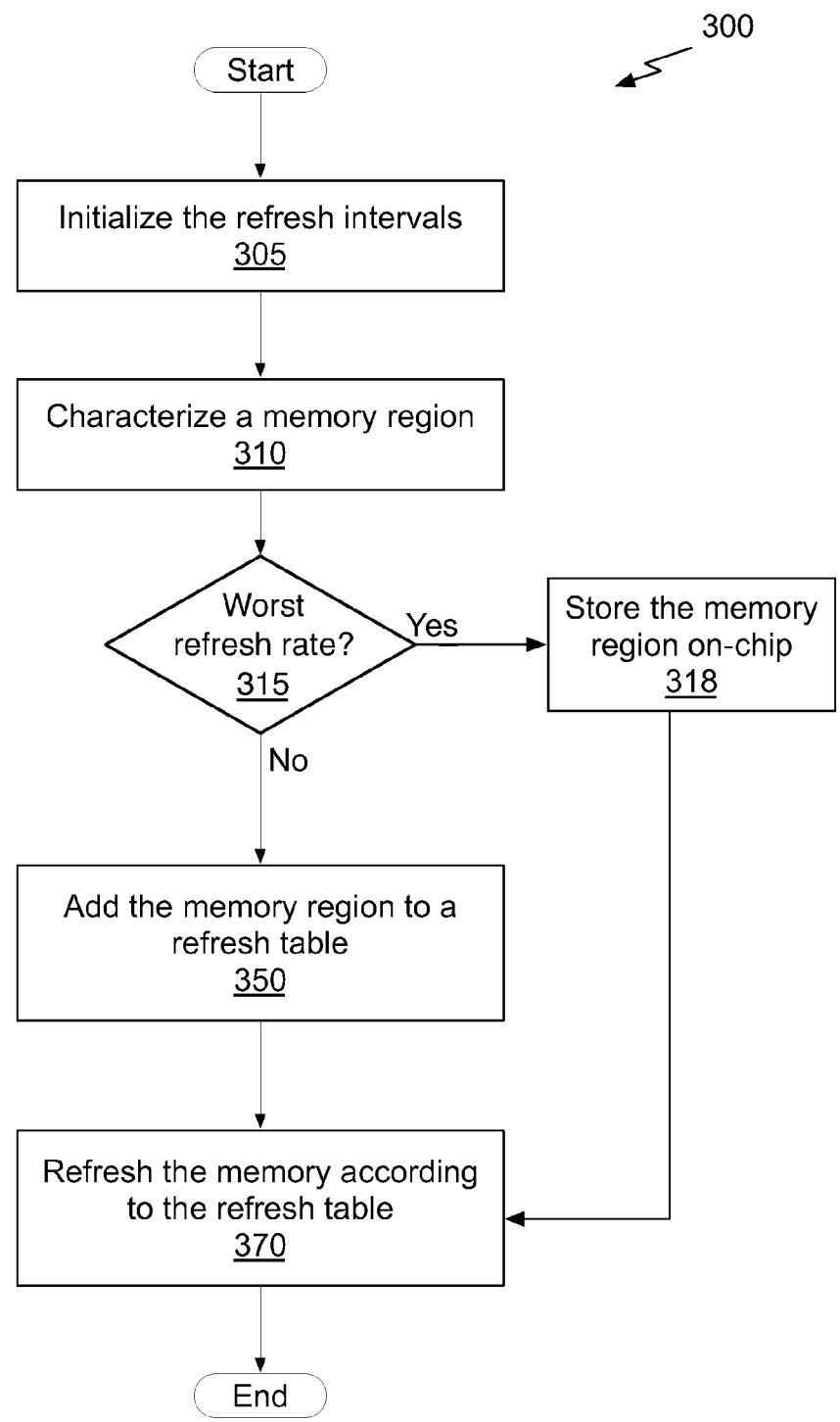
FIG. 3 illustrates another flowchart of a method for refreshing rows of a DRAM at different rates, in accordance with one embodiment.

FIG. 3 illustrates another flowchart 300 of a method for refreshing regions of a DRAM at different rates, in accordance with one embodiment. At step 305, the refresh intervals stored in the refresh table 265 are initialized to equal the refresh interval specified by the DRAM supplier. At step 310, a memory region is tested by the characterization unit 260 to generate characterization information for the memory region. The step 310, may be performed while a device including the memory controller 250 is operating and even if the memory controller 250 is accessing the DRAM 280 as long as the accesses do not interfere with the testing performed by the characterization unit 260 (i.e, the accesses should not inadvertently refresh the memory region being characterized). For example, other regions of the memory may be accessed or refreshed while a particular memory region is tested. In one embodiment, during characterization, accesses to the memory region being characterized may be mapped to the memory region storage 255 and if any data is written during characterization, the memory region storage 255 is copied back to the region of the DRAM 280 that was characterized. In another embodiment, during characterization, accesses to the memory region being characterized are deferred until characterization is completed. An exemplary method for performing step 310 is described in conjunction with FIG. 4A.

At step 315, the characterization unit 260 determines if the refresh rate of the memory region is the worst refresh rate that has been found so far for any memory regions that have been tested, and, if so, then at step 318, the data stored in the memory region is stored on-chip in the memory region storage 255 (i.e., accesses to the one or more regions of memory are mapped to the memory region storage 255). In one embodiment, the refresh interval that is shortest (i.e., lowest value) is considered to indicate the memory region having the worst refresh rate. In one embodiment, the memory region storage 255 is not configured to replace one or more of the memory regions and steps 315 and 318 are omitted.

Otherwise, at step 350, the memory region is added to the refresh table 265. An exemplary method for performing step 350 is described in conjunction with FIG. 4B. An exemplary method for performing step 350 is described in conjunction with FIG. 4C. At step 370, the memory refresh unit 270 refreshes the DRAM 280 according to the refresh table 265. In one embodiment, one or more of steps 305, 310, 315, 318, 350, and 370 are performed while the device including the memory controller 250 is idle or is not operating.

Figure 4A:
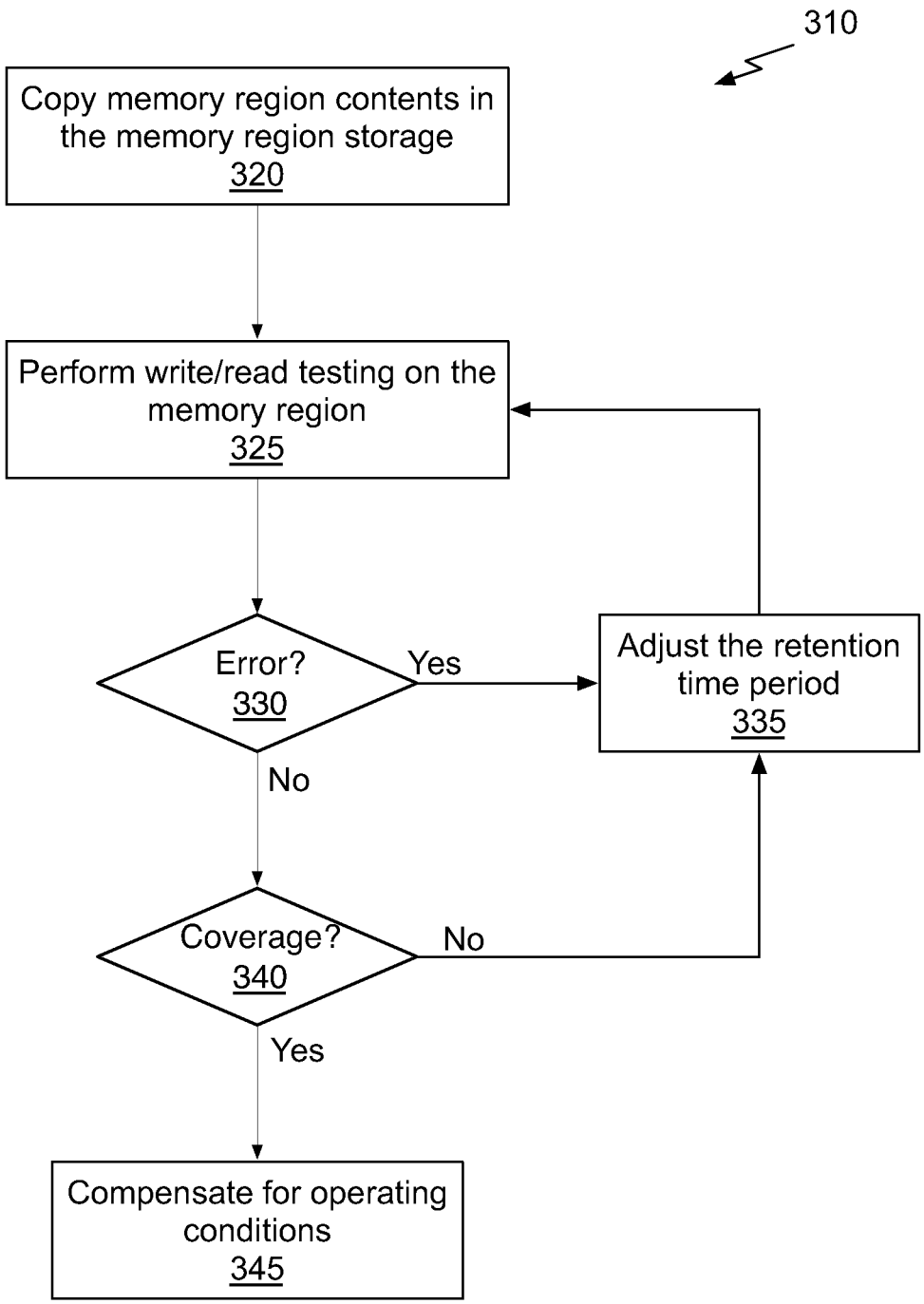
FIG. 4A illustrates a flowchart for a step shown in FIG. 3, in accordance with one embodiment.

FIG. 4A illustrates a flowchart for step 310 shown in FIG. 3, in accordance with one embodiment. At step 320, the characterization unit 260 copies the contents (i.e., data) of a memory region in the DRAM 280 into the memory region storage 255. At step 325, the characterization unit 260 performs characterization testing on the memory region in the DRAM 280 using a retention time period. At step 330, the characterization unit 260 determines if an error occurred for the retention time period, and, if so, at step 335, the characterization unit 260 adjusts the retention time period and returns to step 325. Otherwise, if an error did not occur for the retention time period, at step 340, the characterization unit 260 determines if additional retention time periods should be used to characterize the memory region, and, if so, the characterization unit 260 proceeds to step 335. In one embodiment, the characterization unit 260 ensures that a stepped back retention time period has been tested at step 340. Otherwise, the characterization process is complete, and at step 345 the characterization unit 260 adjusts the retention time period for the operating conditions relative to reference operating conditions (i.e., reference voltage level and/or temperature). The refresh interval that is determined for the memory region is set to the retention time period after compensating for operating conditions.

The characterization unit 260 provides the refresh interval for a region to the refresh table 265. The number of refresh registers that are included in the refresh table 265 is limited. Because a specific refresh interval cannot typically be stored for each row of the DRAM 280, the memory regions are encoded as refresh regions that may include two or more rows (or pages) having different characterization information with the same refresh interval (the minimum refresh interval of the two of more rows). In other words, rows having a low refresh interval may be grouped with rows having a higher refresh interval to reduce the number of refresh regions to a number for which characterization information can be stored in the refresh table 265.

Figure 4B:
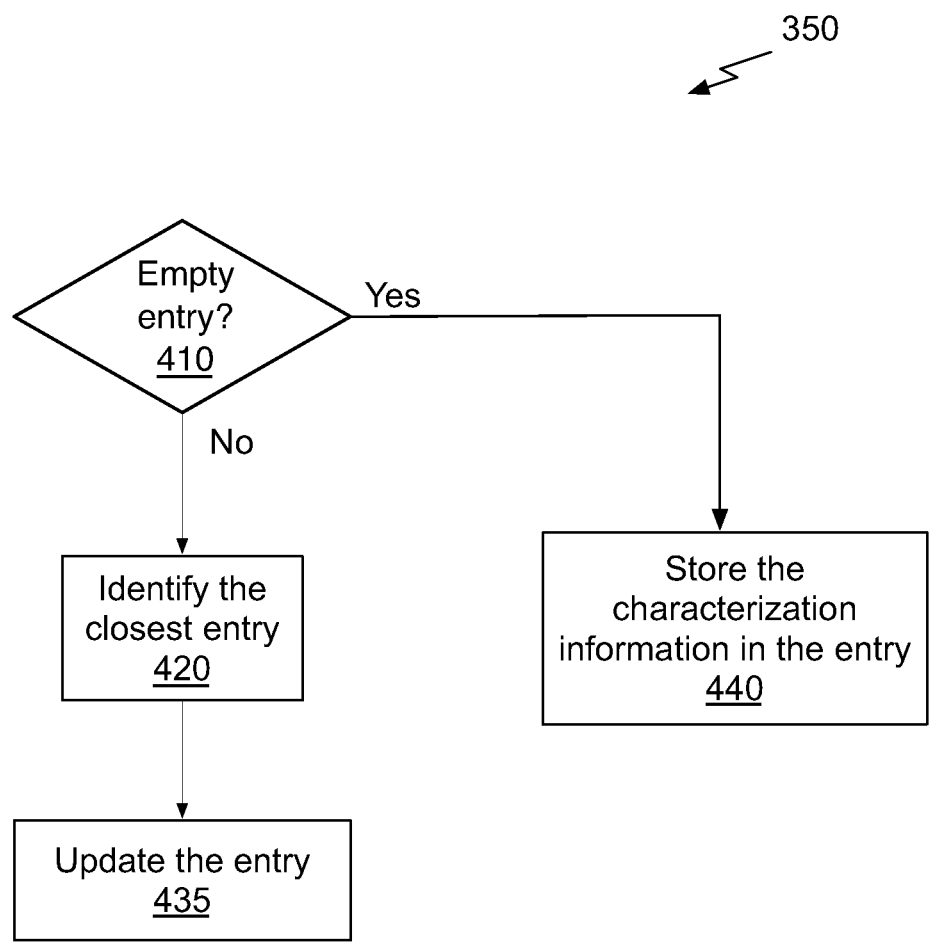
FIG. 4B illustrates a flowchart for another step shown in FIG. 3, in accordance with one embodiment.

FIG. 4B illustrates a flowchart for step 350 shown in FIG. 3, in accordance with one embodiment. The flowchart shown in FIG. 4B corresponds with an embodiment of the refresh table 265 that stores start and end addresses to define each refresh region. At step 410, the refresh table 265 determines if an entry (i.e., refresh register) is available for storing the characterization information, and, if so, then at step 440, the characterization information for the memory region is stored in the entry. In one embodiment, when the memory region is within a refresh region the refresh table 265 stores the characterization information for the memory region as a priority sub-region.

Otherwise, when no entries are available at step 410, at step 420, the refresh table 265 identifies an entry that is "closest" to the memory region. Closeness may be determined in terms of refresh interval of the memory region or in terms of the single address or start and end addresses for the memory region. In one embodiment, the refresh table 265 may consider entries having refresh intervals that are shorter than the refresh interval of the memory region to be closer than entries having refresh intervals that are longer than the refresh interval of the memory region. When more than one entry is identified as the "closest" to the memory region because the entries have the same refresh intervals, one entry is selected. When memory regions are specified using a single address (bank and/or row) with each bit encoded using 2-bit 0,1,X values, the one entry that is selected may be the entry having an address that is closer in hamming distance to the address of the memory region. The encoding of one or more bits of the single address may be changed from a "0" or "1" to an "X" to combine the memory region into the entry. Changing more than one bit of the single address may cause additional regions of the memory to be combined into the entry. Therefore, the refresh interval should be updated to the shortest refresh interval of the combined regions of the memory. When regions are represented using start and end addresses, the one entry that is selected may be the entry that is closest to the memory region in linear address space. Either the start or end address of the entry is changed to combine the memory region into the entry. Again, changing the start or end address may cause additional regions of the memory to be combined into the entry so, the refresh interval should be updated to the shortest refresh interval of the combined regions of the memory.

In another embodiment, the refresh table 265 may consider entries having single addresses that are closest in hamming distance to the memory region represented as a single address. with each bit encoded using 2-bit 0,1,X values. When more than one entry is identified as the "closest" to the memory region because the same number of bits of the single address differ, one entry is selected. The one entry that is selected may be the entry having a refresh interval that is closest to the refresh interval of the memory region. Because one or more bits of the single address are changed from a "0" or "1" to an "X" to combine the memory region into the entry, the refresh interval should be updated to the shortest refresh interval of the combined regions of the memory. When regions are represented using start and end addresses, the refresh table 265 may consider entries that are closest to the memory region in linear address space. When more than one entry is identified as the "closest" to the memory region, one entry is selected. The one entry that is selected may be the entry having a refresh interval that is closest to the refresh interval of the memory region. Either the start or end address of the entry is changed to combine the memory region into the entry. Again, changing the start or end address may cause additional regions of the memory to be combined into the entry so, the refresh interval should be updated to the shortest refresh interval of the combined regions of the memory. The refresh interval of additional regions may be considered by the refresh table 265 when selecting the one entry to minimize the refresh interval of the combined regions of the memory.

At step 435 the refresh table 265 updates the entry, as needed to combine the memory region into the entry (i.e., updates one or more of the single address, start or end address, priority, and refresh interval).

It should be noted that, while various optional features are set forth herein in connection with storing the characterization information for regions of a memory and combining refresh region entries, such features are for illustrative purposes only and should not be construed as limiting in any manner.

Figure 4C:
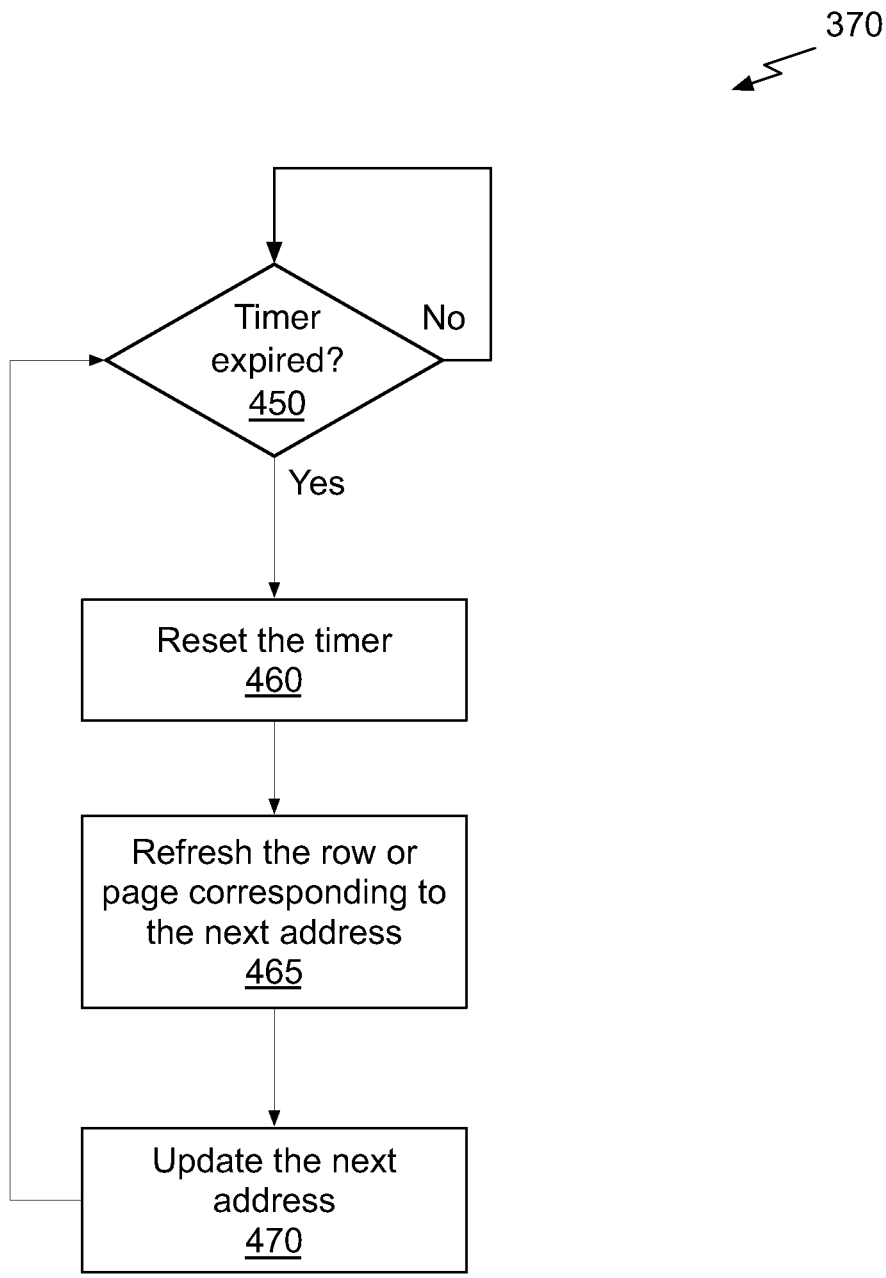
FIG. 4C illustrates a flowchart for another step shown in FIG. 3, in accordance with one embodiment.

FIG. 4C illustrates a flowchart for the step 370 shown in FIG. 3, in accordance with one embodiment. Each entry in the refresh table 265 includes a timer field. The timer field is initialized to the number of timesteps (e.g., timestep=16 µs) between refresh operations to rows or pages in the refresh region. For a refresh region R with size |R|, the timer is set to ri(R)/(timestep*|R|), where ri is the refresh interval. The refresh table 265 is configured to update (i.e., decrement) the timer fields of each entry each timestep.

At the step 450, the memory refresh unit 270 is configured to check if any of the timers stored in the refresh table 265 have expired, and, if not, step 450 is repeated. When a timer has expired, at step 460, the memory refresh unit 270 resets the timer to the initial value. At step 465, the memory refresh unit 270 performs a memory refresh operation on the rows or page in the DRAM 280 specified by the next address field in the entry of the refresh table 265 having the expired timer. At step 470, when the memory refresh operation is complete, the memory refresh unit 270 updates the next address field to point to the next address to be updated in the refresh region (when updated, the address may wrap). In another embodiment, the memory refresh operations may be performed close together in time. However, performing a burst of refresh operations instead of spacing the refresh operations out in time may cause a spike in power dissipation and may also reduce the bandwidth available for memory accesses.

Figure 5:
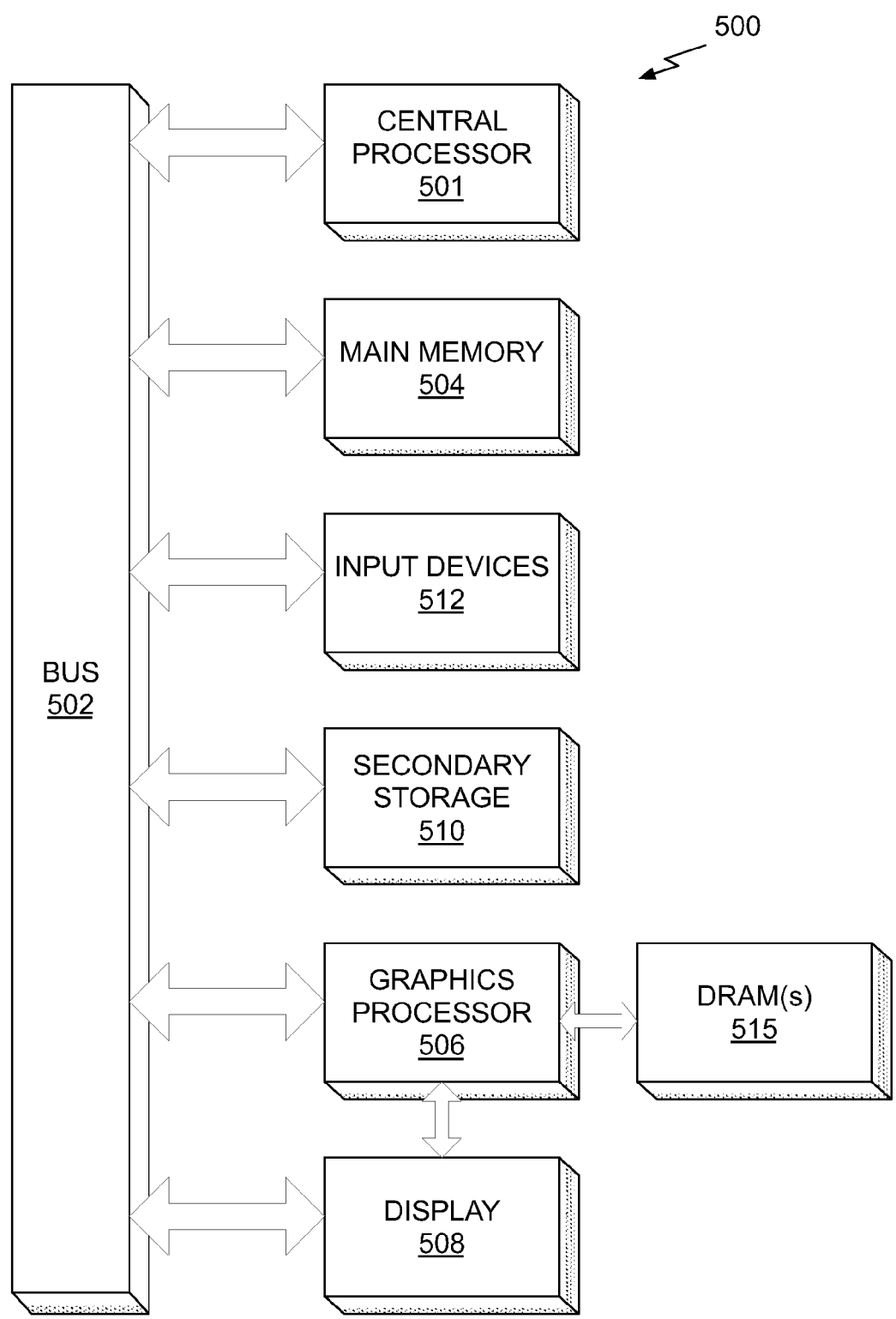
FIG. 5 illustrates an exemplary system in which the various architecture and/or functionality of the various previous embodiments may be implemented.

FIG. 5 illustrates an exemplary system 500 in which the various architecture and/or functionality of the various previous embodiments may be implemented. As shown, a system 500 is provided including at least one central processor 501 that is connected to a communication bus 502. The communication bus 502 may be implemented using any suitable protocol, such as PCI (Peripheral Component Interconnect), PCI-Express, AGP (Accelerated Graphics Port), HyperTransport, or any other bus or point-to-point communication protocol(s). The system 500 also includes a main memory 504. Control logic (software) and data are stored in the main memory 504 which may take the form of random access memory (RAM).

The system 500 also includes input devices 512, a graphics processor 506, and a display 508, i.e. a conventional CRT (cathode ray tube), LCD (liquid crystal display), LED (light emitting diode), plasma display or the like. User input may be received from the input devices 512, e.g., keyboard, mouse, touchpad, microphone, and the like. In one embodiment, the graphics processor 506 may include a plurality of shader modules, a rasterization module, etc. Each of the foregoing modules may even be situated on a single semiconductor platform to form a graphics processing unit (GPU). The graphics processor 506 may be coupled to one or more DRAM devices 515 and may be configured to refresh different regions of the DRAM(s) at different rates based on characterization information. In one embodiment, the central processor 501 is coupled to one or more DRAM devices 515 and is configured to refresh different regions of the DRAM(s) at different rates based on characterization information. The DRAM 515 may be implemented as the DRAM 280 in FIG. 2.

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user. One or more of the systems 500 shown in FIG. 5, may be incorporated in the system 500 to provide power to one or more of the chips.

The system 500 may also include a secondary storage 510. The secondary storage 510 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner. Computer programs, or computer control logic algorithms, may be stored in the main memory 504 and/or the secondary storage 510. Such computer programs, when executed, enable the system 500 to perform various functions. The main memory 504, the storage 510, and/or any other storage are possible examples of computer-readable media.

In one embodiment, the architecture and/or functionality of the various previous figures may be implemented in the context of the central processor 501, the graphics processor 506, an integrated circuit (not shown) that is capable of at least a portion of the capabilities of both the central processor 501 and the graphics processor 506, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 500 may take the form of a desktop computer, laptop computer, server, workstation, game consoles, embedded system, and/or any other type of logic. Still yet, the system 500 may take the form of various other devices including, but not limited to a personal digital assistant (PDA) device, a mobile phone device, a television, etc.

Further, while not shown, the system 500 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
   refreshing a first region of a memory at a first refresh rate;
   characterizing the first region to measure data retention characteristics of the first region by:
   copying data from the first region of the memory to a storage resource,
   writing a pattern to the first region of the memory,
   waiting for a retention time period, and
   reading the first region to obtain read data; and
   refreshing a second region of the memory at a second refresh rate that is different than the first refresh rate.

2. The method of claim 1, wherein the first region includes one or more pages of the memory and the second region includes one or more additional pages of the memory.

3. The method of claim 1, wherein the first region includes one or more rows of the memory and the second region includes one or more additional rows of the memory.

4. The method of claim 1, wherein the memory is a dynamic random access memory device.

5. The method of claim 1, further comprising adjusting the retention time period when the read data does not match the pattern.

6. The method of claim 1, further comprising storing the retention time period as a first refresh interval when the read data matches the pattern.

7. The method of claim 1, further comprising adjusting the first refresh rate to compensate for a measured temperature compared with a reference temperature.

8. The method of claim 1, further comprising adjusting the first refresh rate to compensate for a measured voltage level compared with a reference voltage level.

9. The method of claim 1, further comprising mapping writes to a third region of the memory and reads from the third region of the memory to the storage resource.

10. The method of claim 1, further comprising:
    characterizing a third region to measure data retention characteristics of the third region;
    determining a third refresh rate based on the data retention characteristics of the third region; and
    determining that the third refresh rate is greater than the first refresh rate.

11. The method of claim 1, further comprising storing characterization data for the first region of the memory in a first entry of a table.

12. The method of claim 1, further comprising combining characterization data for a third region of the memory into the first entry of the table that corresponds to the first region of the memory.

13. The method of claim 1, wherein the first region of the memory is specified as a single address and each bit of the single address is encoded as a 0, 1, or X value.

14. The method of claim 1, wherein the first region of the memory is specified using a start address and an end address.

15. The method of claim 1, wherein a priority is associated with the first region of the memory.

16. The method of claim 1, further comprising
    mapping accesses to the first region of the memory to the storage resource.

17. A system, comprising:
    a dynamic memory; and
    a memory controller that is coupled to the dynamic memory and configured to:
    refresh a first region of the dynamic memory at a first refresh rate;
    characterize the first region to measure data retention characteristics of the first region by:
    copying data from the first region of the memory to a storage resource,
    writing a pattern to the first region of the memory,
    waiting for a retention time period, and
    reading the first region to obtain read data; and
    refresh a second region of the dynamic memory at a second refresh rate that is different than the first refresh rate.

18. The system of claim 17, wherein the memory controller is further configured to adjust the retention time period when the read data does not match the pattern.

19. The system of claim 17, wherein the memory controller is further configured to store the retention time period as a first refresh interval when the read data matches the pattern.

20. The method of claim 1, wherein the storage resource is located within a memory controller that is coupled to the memory.

21. The system of claim 17, wherein the storage resource is located within the memory controller.

22. The system of claim 17, wherein the first region includes one or more pages of the memory and the second region includes one or more additional pages of the memory.

23. The system of claim 17, wherein the first region includes one or more rows of the memory and the second region includes one or more additional rows of the memory.

\* \* \* \* \*